United States Patent

Chapman

[15] 3,696,252

[45] Oct. 3, 1972

[54] ACTIVE FILTER FOR SELECTING AND CONTROLLING SIGNALS

[72] Inventor: Ronald H. Chapman, Wheaton, Ill.

[73] Assignee: Motorola, Inc., Franklin Park, Ill.

[22] Filed: Nov. 20, 1970

[21] Appl. No.: 91,306

[52] U.S. Cl. ..................307/233, 307/295, 328/138, 328/140, 328/167

[51] Int. Cl. ..............................................H03k 1/16

[58] Field of Search ......307/233, 271, 295; 328/136, 328/138, 140, 167

[56] References Cited

UNITED STATES PATENTS

| | | | |
|---|---|---|---|
| 3,559,081 | 1/1971 | Baudino, Jr. et al. | ...307/233 X |
| 3,529,248 | 9/1970 | Boelke | ...................328/138 X |
| 3,539,829 | 11/1970 | Langendorf et al. | ....328/138 X |
| 3,562,675 | 2/1971 | Urell | ......................328/167 X |
| 3,577,008 | 5/1971 | Craft | .........................307/233 |

*Primary Examiner*—Stanley T. Krawczewicz
*Attorney*—Mueller & Aichele

[57] ABSTRACT

The signal control circuit utilizes an active, bandpass filter having a first resonant frequency virtually equal to the frequency of a first input signal selected thereby. An amplitude responsive circuit changes the resonant frequency of the filter to a second predetermined value during the times that the instantaneous magnitude of the output signal, provided in response to the first input signal, exceeds a threshold level. This action maintains the amplitude of the output signal at a substantially constant level even though the amplitude of the first input signal is varying. Moreover, the threshold level and second resonant frequency are chosen so that the phase difference between the first input signal and the output signal remains relatively constant even though the frequency of the first input signal is varying so that the output signal can be damped out by a second input signal having a selected phase relationship to the first input signal.

14 Claims, 7 Drawing Figures

Inventor
RONALD H. CHAPMAN

BY

Mueller & Aichele
ATTYS.

ACTIVE FILTER FOR SELECTING AND CONTROLLING SIGNALS

BACKGROUND OF THE INVENTION

It is common practice for a plurality of high frequency communication transmitters to operate at the same carrier frequency because of the crowded conditions of radio communication channels. In some applications it is advantageous that all receivers tuned to this carrier frequency reproduce information from all of such transmitters; however, in other applications it is desirable that certain receivers tuned to the carrier frequency produce only particular information signals. Hence, in these applications it is necessary that a selective calling or receiving provision be included in the system so that a given receiver will produce only signals possible having information intended for that station. This provision increases privacy in the communications link, and in the case of voice equipment, makes it unnecessary for operators to hear signals of no concern to them.

One such selective calling system is described in U.S. Pat. No. 2,974,221, entitled Communication System, which issued on Mar. 17, 1961, to Robert Peth and is assigned to the assignee of the present invention. This calling system is comprised of a transmitter operating at a particular carrier frequency which selectively communicates with any one of a plurality of normally silent receivers all tuned to that carrier frequency. Each receiver includes a frequency selective electromechanical device which is set into vibration by a selective calling signal, which is demodulated from the carrier, of a particular frequency. Vibration of such device "unlatches" squelch circuitry to allow the information accompanying the calling signal to be reproduced by the loudspeaker of the receiver.

U.S. Pat. No. Re 26,361, entitled Electromechanical Frequency Responsive Translating Device, which issued on Mar. 12, 1968, to Charles W. Mooney, et al., and which is also assigned to the assignee of the present invention, describes one electromechanical device suitable for use in these systems. Such electromechanical devices offer a relatively high Q e.g., 135, at low audio frequencies e.g., 120 Hz. An amplitude limiter is included in these devices which controls the amplitude of the output signal, the amount of energy stored in the device, and the phase relationship of the energy stored to the calling signal. Control of the amount and phase of stored energy facilitates attenuation of the output signal within a predetermined time by a turn-off or reverse burst signal. Although such frequency responsive electromechanical devices have been satisfactorily employed in many selective calling systems, they have some disadvantages, such as a tendency to be undesirably activated or stopped by mechanical vibration or shock. Moreover, the resonant frequency of such devices may be a function of the surrounding mountings and orientation. Furthermore, there are cost and time disadvantages associated with the assembly requirements thereof.

SUMMARY OF THE INVENTION

An object of the invention is to provide a solid state electronic device having no moving parts which is suitable for use as a frequency selector in a selective calling system utilizing audio frequency signals.

Another object of the invention is to provide a solid state frequency selector which is inexpensive and suitable for manufacture in integrated circuit form.

Still another object of the invention is to provide an active bandpass filter which provides a constant amplitude output signal, even though the amplitude of the input signal is varying.

A further object of the invention is to provide an active bandpass filter which provides a controlled phase angle between its input and output signals.

A still further object of the invention is to provide an active bandpass filter which, in response to a first input signal of selected frequency, develops an output signal having the same frequency and a particular phase and which output signal is attenuated within a selected time by a second input signal having the same frequency but a different phase.

An additional object of the invention is to provide a solid state circuit suitable for replacing electromechanical frequency responsive devices having mechanical limiters.

The signal control circuit of the invention employs an active bandpass filter and an amplitude responsive circuit. This circuit may be used in an electronic system which requires a substantially constant amplitude output signal in response to a first input signal of selected frequency, which output signal can be attenuated in a preselected time by a second input signal which is applied after the first input signal ceases. The active filter has a first resonant frequency which is about equal to the frequency of the input signals and a second resonant frequency. During the times that the instantaneous magnitude of alternate half cycles of the output signal exceeds a predetermined threshold, the amplitude responsive circuit either connects or disconnects a component to or from the active filter. This changes the resonant frequency of the filter between the first and second predetermined values. Since the times during which the active filter is switched to its second resonant frequency are proportional to the amplitude of the first input signal, the amplitude of the output signal and energy stored in the filter is maintained at a relatively constant level even though the amplitude of the first input signal changes. Furthermore, the relation between the threshold level and the amplitude of the first input signal is selected so that the active filter operates at its second resonant frequency for a portion of each alternate half cycle of the input signal. This second resonant frequency is chosen to cause a substantial difference in phase between the first input signal and the output signal, which remains essentially constant even though the frequency of the first input signal changes by small amounts. By keeping the amount of energy stored in the active filter at a selected level and by controlling the phase of that energy, the signal control circuit facilitates the use of the second input signal which introduces energy into the active filter which is 180° out-of-phase with the energy stored therein, to attenuate the output signal in the predetermined period of time.

DETAILED DESCRIPTION OF THE PREFERRED EMBODIMENT

Figure 1:
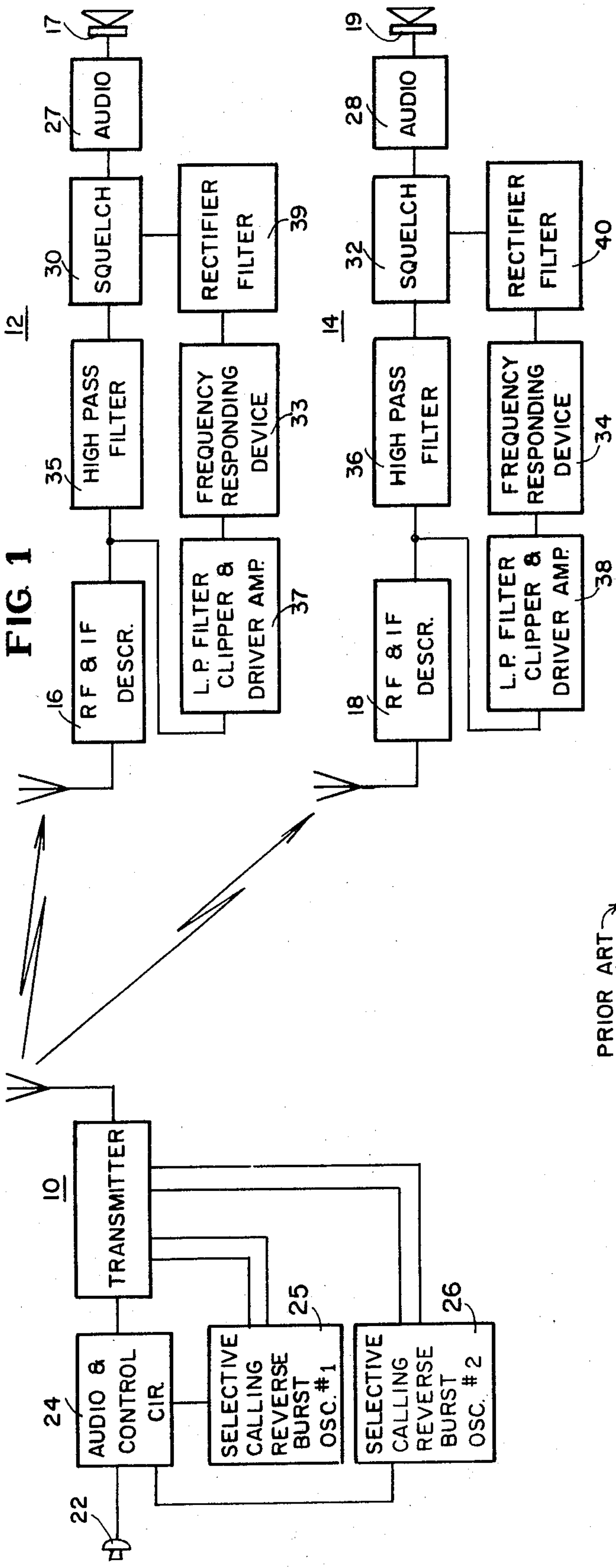
FIG. 1 is a simplified block diagram of a selective calling system employing a transmitter and two receivers.

To facilitate a clear understanding of the invention, one of its many possible environments of operation will first be described. FIG. 1 illustrates a simplified block diagram of a communication system including a transmitter 10 and receivers 12 and 14, which operate on the same communication channel. In this communication system, a selective calling provision is required so that receiver 12 cannot reproduce at loudspeaker 17 messages intended for receiver 14 and so that receiver 14 cannot reproduce at loudspeaker 19 messages intended for receiver 12. This provision, therefore, increases the privacy of the communications system and makes it unnecessary for the operator of a receiver to hear messages which are of no concern to him.

To facilitate selective calling, transmitter 10 sends a carrier wave which is modulated both by information and a sinusoidal selective calling signal of a particular low audio frequency corresponding to the resonant frequency of a signal control circuit of the intended receiver. The information may be derived from microphone 22 and processed by associated audio circuit 24. The selective calling signal is derived from either oscillator 25, which operates at a first selected audio frequency, or oscillator 26, which operates at a second selected audio frequency. Transmitter 10 contains circuitry for selecting the oscillator output corresponding to the particular receiver through which it is desired to convey the information signal.

Stages 16 and 18 of receiver 12 and 14 receive and demodulate the carrier of transmitter 10. Although demodulated information signals occur at the outputs of stages 16 and 18, they are normally prevented from being applied to the respective audio stages 27 and 28 by normally nonconductive squelch circuits 30 and 32. However, if the output of stage 16, for instance, includes a tone at the resonant frequency of device 33, a control signal is developed at the output thereof which renders the squelch circuit 30 conductive thereby allowing the information signal to be applied to audio stage 27 and reproduced at loudspeaker 17.

Figure 2:
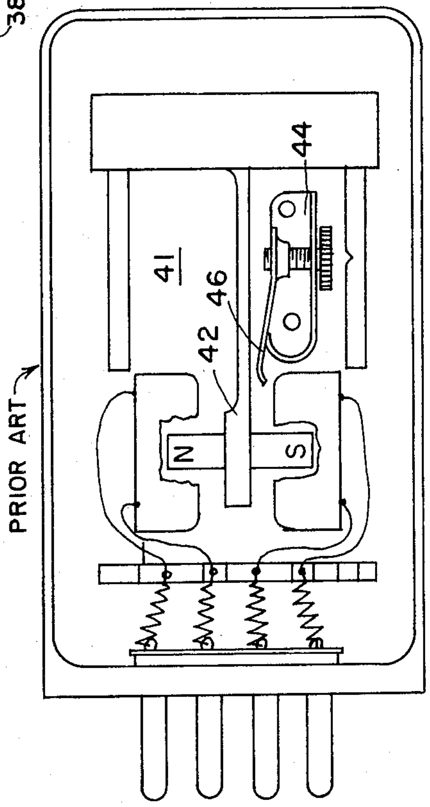
FIG. 2 is a plan view of a prior art electromechanical frequency responsive device utilized to select and control a calling signal of a particular frequency.

In the past, resistor-capacitor filters or electromechanical resonant devices, for instance, of the form shown in FIG. 2, have been used for frequency responsive devices 33 or 34. This device includes a reed or resonant member 42 which vibrates at a predetermined mechanical resonant frequency. A mechanical limiter 44 is placed adjacent reed 42 and has finger 46 which prevents the excursion of the reed from exceeding a given amplitude toward the limiter. This limiting action controls the phase and amplitude of the output signal from the electromechanical device. Each of such devices have a first resonant frequency within the range extending from about 60 Hz to about 200 Hz. This range of frequencies may be filtered from the outputs of stages 16 and 18 which are applied to audio stages 27 and 28 respectively by high pass filters 35 or 36 without affecting the intelligibility of the audio signal. Low pass filter and driver amplifier stages 37 and 38 are connected between the outputs of input stages 16 and 18 and the inputs of frequency responsive devices 33 and 34. Stages 37 and 38 filter out unwanted frequencies and adjust the amplitude of the calling or first input signal so that it drives the frequency responsive device in a desired manner to produce a controlled sinusoidal output signal at the output of the device. In response to a sinusoidal output which has at least a predetermined amplitude, circuits 39 or 40 provide a signal to squelch circuits 30 or 32 which has sufficient amplitude to render the same conductive. The foregoing selective calling provision obviates the need for squelch level setting controls thereby permitting noncritical modulation requirements of the carrier by the selective calling signal developed at transmitter 10.

Figures 3, 6:
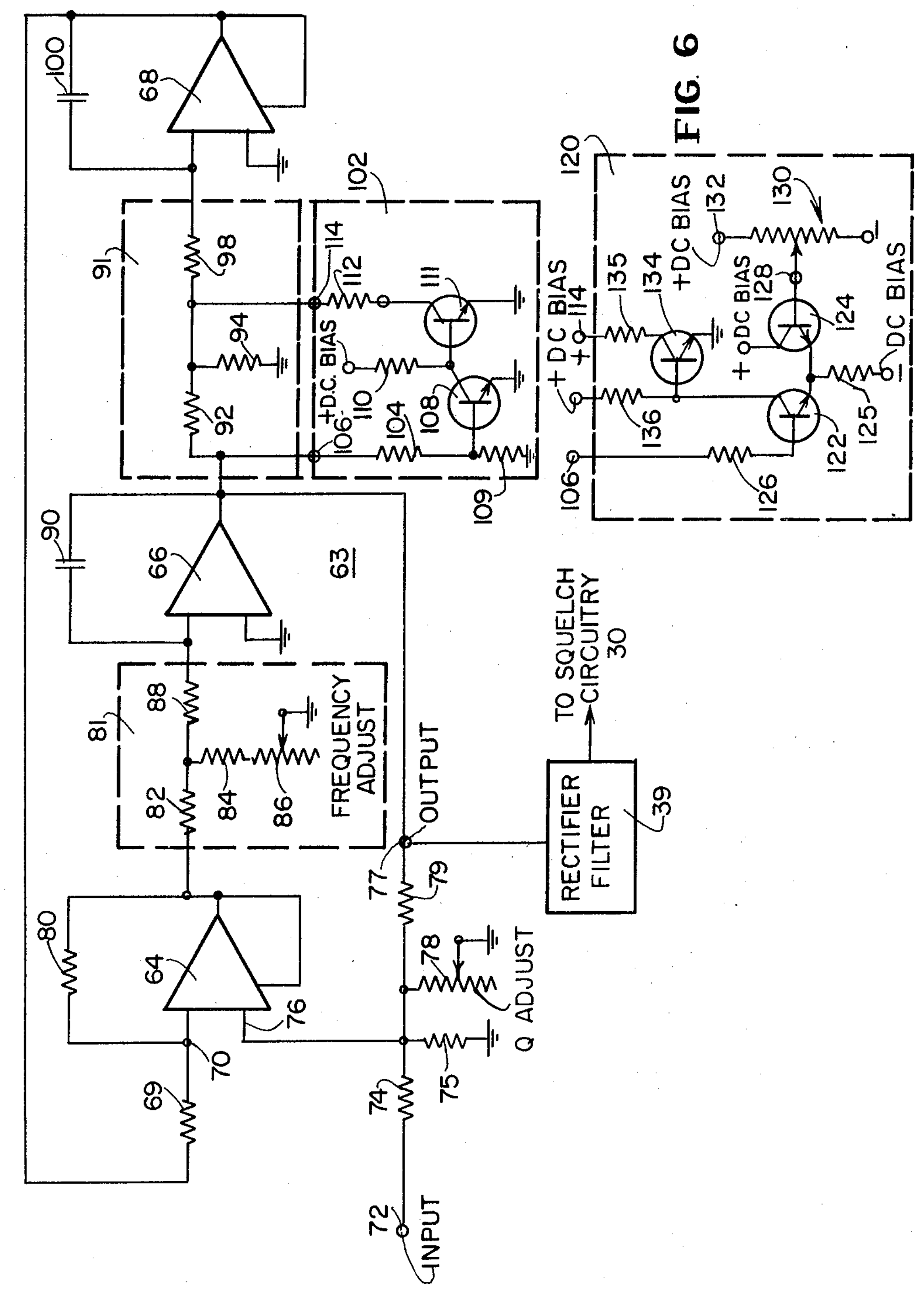
FIG. 3 is a schematic diagram of a frequency selecting and control circuit in accordance with the invention.
FIG. 6 is a circuit diagram of an amplitude responsive circuit providing an adjustable threshold level and which can be utilized with the circuit of FIG. 3.

In FIG. 3 there is a schematic diagram of a calling signal selecting and control circuit, including an active bandpass filter 63 and an amplitude responsive circuit 102. The bandpass filter 63 is of known construction and performs generally the same useful operations as the electromechanical device 41 (FIG. 2) but does not have certain disadvantages of device 41. Bandpass filter 63 includes operational amplifiers 64, 66 and 68 which are coupled in series by T-networks 81 and 91. Coupling networks of other configurations could be employed between the operational amplifiers. The output of amplifier 68 is fed back through resistor 69 to a first input 70 of amplifier 64. Assuming the circuit of FIG. 3 is utilized for block 33 of receiver 12 of FIG. 1, the selective calling or first input signal is applied by driver amplifier 37 to input terminal 72. Terminal 72 is connected through the voltage divider comprised of resistors 74 and 75 to second input 76 of amplifier 64. The output signal is derived from the first input signal by the filter 63 and applied to terminal 77 which is connected in a conductive path running from the output of operational amplifier 66 to the input of rectifier filter 39. Potentiometer 78 in cooperation with resistor 79 which is connected from output terminal 77 to resistor 74, facilitates "Q" or quality factor adjustment of the filter in a known manner.

Resistor 80 is connected from the input to the output of operational amplifier 64. Resistor 69 and resistors 80 may be chosen to have equal values thereby enabling operational amplifier 64 to operate as a phase inverter. A T-network 81 comprised of resistors 82, 84, frequency adjust potentiometer 86 and resistor 88, connects the output of operational amplifier 64 to the input of operational amplifier 66. Capacitor 90 is connected from the input to the output of operational amplifier 66. The equivalent resistance of network 81 acts in cooperation with capacitor 90 to enable operational amplifier 66 to function as a Miller integrator. Another T-network 91 is formed by resistors 92, 94 and 98, and the equivalent resistance of amplitude responsive circuit 102. Capacitor 100 is connected from the input to the output of operational amplifier 68. The total equivalent resistance of network 91 in cooperation with capacitor 100 enables operational amplifier 68 to also perform as a Miller integrator.

The approximate resonant frequency for active filter 63 is expressed by the following equation derived by known circuit analysis techniques:

(1)
$$w_0=\sqrt{\frac{R_{80}}{R_{81}C_{90}R_{91}C_{100}R_{69}}}$$

where:

$C_{100}$ = capacitance of capacitor 100
$C_{90}$ = capacitance of capacitor 90
$R_{80}$ = resistance of resistor 80
$R_{69}$ = resistance of resistor 69
$R_{81}$ = equivalent resistance of network 81
$R_{91}$ = equivalent resistance of network 91

Figure 4:
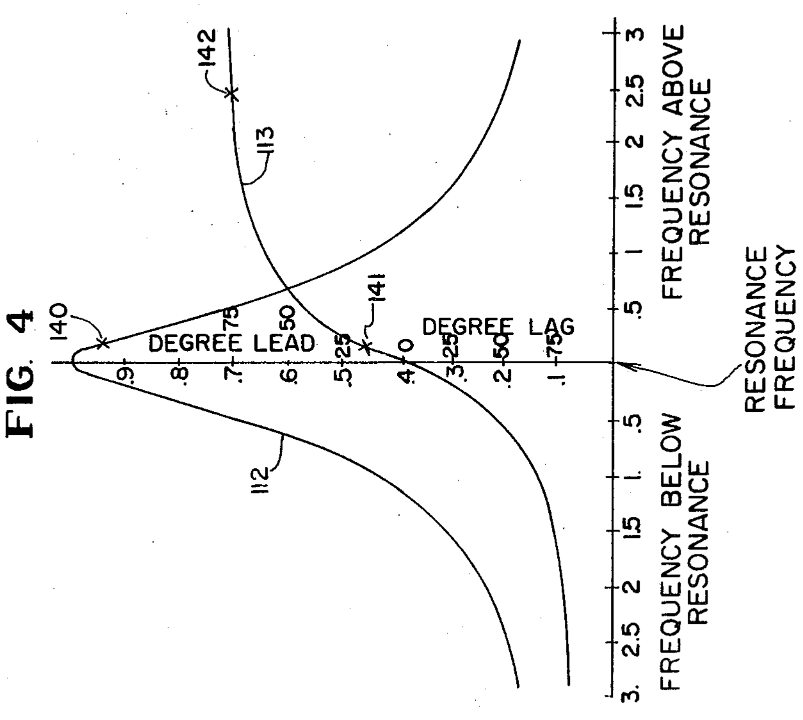
FIG. 4 illustrates resonance curves for a parallel tuned circuit which are useful in explaining the operation of the control circuit of FIG. 3.

Since the transfer function of active bandpass filter 63 is the same as the transfer function of a single tuned, parallel resonant circuit, the output voltage amplitude normalized with respect to the input voltage as a function of frequency and the phase shift of the output voltage relative to the input voltage as a function of the frequency are respectively approximated by resonance or frequency response characteristic curves 112 and 113 shown in FIG. 4. It is apparent from curve 112 of FIG. 4 that the amplitude of the output voltage is maximum and from curve 113 that the phase angle between the input and output voltage is zero at the resonant frequency. However, if the frequency and amplitude of the input voltage applied to filter 63 remains constant and the resonant frequency of the filter is increased or decreased, the amplitude of the output voltage decreases and the phase angle between the input voltage and the output voltage changes. For instance, referring to curve 112 if the resonant frequency of the filter is decreased, the amplitude of the output voltage will likewise decrease, and referring to curve 113 the phase angle between the input and output voltage will change from zero degrees to a lagging value. The slope of the phase characteristic curve 113 indicates that the rate of change of the phase angle is much more rapid for frequency deviations about a frequency near the resonant frequency than it is for frequency deviations about a frequency farther removed from the resonant frequency.

Threshold responsive switching circuit 102 is connected to the T-network 91 and acts to modify the characteristics thereof. The circuit 102 is connected from one end of resistor 98 of T-network 91 and a reference potential and presents a resistance in parallel with resistor 94 of this network. Circuit 102 changes the resonant frequency of the active filter of FIG. 3 from a first predetermined value to a second predetermined value in response to the instantaneous magnitude of alternate half cycles of the output voltage of the filter exceeding and remaining greater than a threshold level. Circuit 102 includes resistor 104 which is connected from the output of operational amplifier 66, and through terminal 106 to the base of amplitude responsive transistor 108. Resistor 109 is connected from the base of transistor 108 to the reference potential. The emitter of transistor 108 is connected to a ground or reference potential. The collector of transistor 108 is connected through load resistor 110 to a direct current (DC) bias supply and to the base of normally conductive switching transistor 111. The emitter of transistor 111 is likewise connected to a ground or reference potential and its collector is connected through resistor 112 and terminal 114 to the junction of resistors 92, 94 and 98.

As shown by Equation (1), the resonant frequency, $w_o$ of the active filter is inversely proportional to the value of the equivalent resistance of T-network 91. Since transistor 111 is normally conductive, the resonant frequency of filter 63 is normally a first selected frequency which is computed from Equation (1) by considering resistor 112 as being connected in parallel with resistor 94 between the junction of resistors 92 and 98 and a reference potential. As the positive-going portion of an input cycle of a selective calling signal 114 exceeds a predetermined level 115 the emitter-base threshold of transistor 108 is overcome by the increase in amplitude of the corresponding alternate half cycles of the output signal of the filter and the transistor is rendered conductive. The values of resistor 104 and 109 can be adjusted to determine the level at which transistor 108 is forward biased.

Because of the high gain in the transfer function of threshold amplifier 108 and switch transistor 111, for instance, a minute change in the amplitude of the output signal will cause a change in resonant frequency of the filter. Therefore, even though the amplitude of the output signal must change a small amount to facilitate the limiting action of the network, the amplitude of the output signal is substantially constant in relation to the amplitude of the input signal or in relation to what it otherwise would be if circuit 102, or some equivalent thereof, was not utilized.

As transistor 108 becomes conductive, the emitter-base voltage of transistor 111 decreases until it cuts off thereby in effect disconnecting resistor 112 from resistor 94 and decreasing the total resistance $R_{91}$ of the T-network until the amplitude falls below the threshold level. Thus, the resonant frequency of the active filter is increased to a second predetermined value during the time intervals when transistor 108 is turned on. When the resonant frequency of the active filter increases the relative amplitude of the output signal as compared to the amplitude of the input signal decreases and there is a change in phase angle between the input signal and output signal of the filter.

Figures 5, 7:
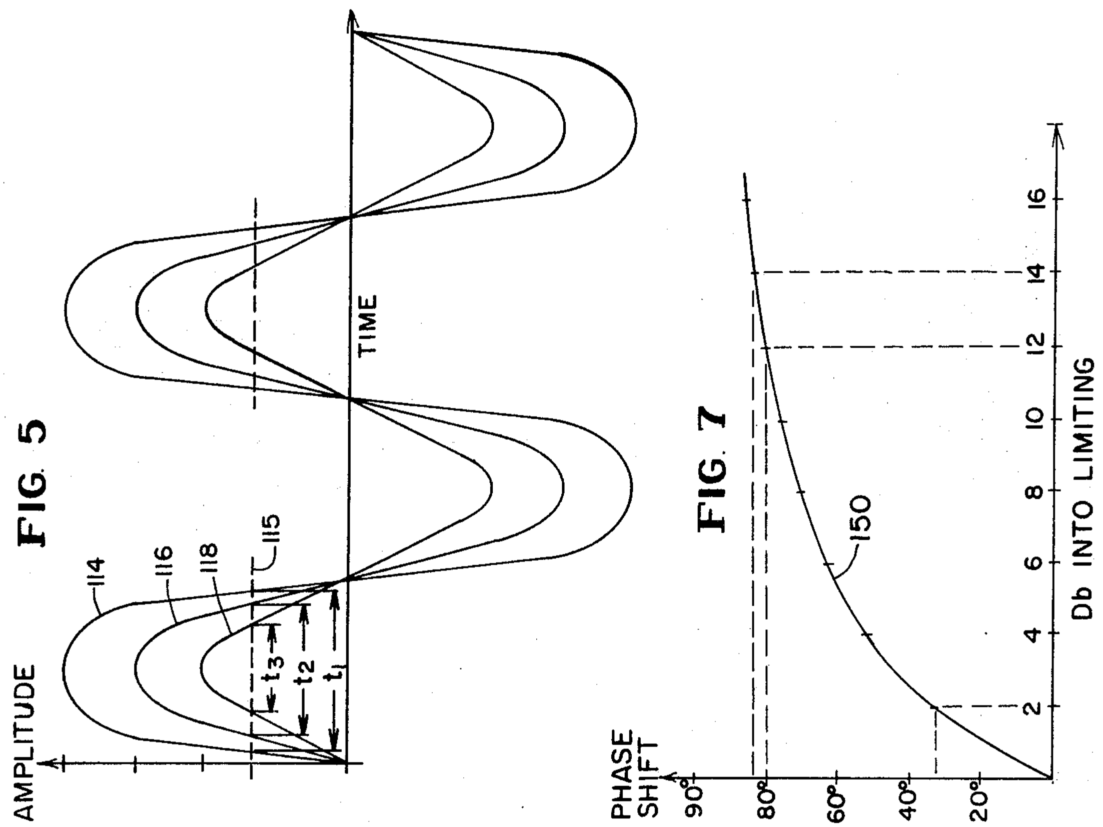
FIG. 5 illustrates a plurality of input signals having the same frequency but different amplitudes which are clipped at the same threshold level.
FIG. 7 is a graph illustrating the phase shift versus mechanical limiting characteristics for the control circuit of FIG. 3.

Referring to FIG. 5, portions of selective calling or first input signals 114, 116 and 118 of decreasing amplitudes are superimposed with respect to each other. The times $t_1$, $t_2$ and $t_3$ represent the time durations during which portions of each half cycle exceed the threshold level 115 established by transistor 108 and resistors 104 and 109 during which the active filter is operated at its second predetermined resonant frequency. The times $t_1$ and $t_2$ have been exaggerated for purposes of illustration, in actual operation the filter would normally operate at its second resonant frequency for a time no greater than $t_3$ or one-fourth of the period. It is apparent from FIG. 5 that the times the filter is operated at its second resonant frequency are proportional to the corresponding amplitudes of the input signal. Thus, the greater the amplitude of the input signal the more the input signal is attenuated by the filter to provide the output signal. Since the attenuation is proportional to the amplitude of the input signal, the output signal at terminal 77 tends to have a constant amplitude even though the amplitude of the input signal varies. This is because the amplitude and phase of the output signal are determined by the amplitude and phase of the energy stored in the filter. During the time that the resonant frequency of the active filter is shifted from the first predetermined value to the second predetermined value, the amount of energy coupled into the filter from the input signal is greatly reduced. The circuit operates to keep the average energy stored in the filter constant thus keeping the amplitude and phase of the output signal constant. A substantially constant amplitude output signal is required to properly operate the squelch circuitry of the previously described receivers 12 and 14. Moreover, the foregoing operation of circuit 102 maintains the amount and phase of energy stored in the active filter at a constant selected quantity to facilitate a controlled turn-off time for the output signal by a second input signal as will be subsequently explained.

FIG. 6 illustrates an alternative threshold sensitive or responsive switching circuit 120 which could be substituted for circuit 102, and which also provides an adjustable threshold which facilitates adjusting the switching between the resonant frequencies of the active filter. Circuit 120 includes a level sensing differential amplifier comprised of transistors 122 and 124. Resistor 126 connects terminal 106 to the base of transistor 122. The emitters of transistors 122 and 124 are connected through resistor 125 to a negative potential. The base of transistor 124 is connected to threshold selecting contact 128 of potentiometer 130. One end of the resistive element of potentiometer 130 is connected to a fixed positive DC potential applied to terminal 132 and the other end is connected to a negative potential. The collector of transistor 124 is connected to the positive DC bias source. The collector of transistor 122 is connected to the base of switching transistor 134 and through load resistor 136 to the DC bias source. The emitter of switching transistor 134 is connected to the reference potential and the collector thereof is connected through resistor 135, which is analogous to resistor 112 of threshold sensitive switching circuit 102, to terminal 114.

The differential amplifier is biased so that transistor 122 is normally nonconductive and transistor 124 is normally conductive. Since transistor 122 is normally nonconductive, transistor 134 is normally conductive thereby essentially placing a ground or reference potential at one end of resistor 135. As the instantaneous magnitude of the input voltage applied to the base of transistor 122 exceeds the threshold voltage, e.g., level 115, provided to the base of transistor 124, transistor 122 becomes conductive and transistor 124 becomes nonconductive thereby causing the voltage on the base of transistor 134 to drop thus rendering transistor 134 nonconductive. This essentially disconnects resistor 135 from T-network 91 so that the resonant frequency of the active filter shifts to its second predetermined value. The threshold level 115 of FIG. 5 at which switching between resonant frequencies occurs can be changed by adjusting potentiometer 130.

In the system as shown in FIG. 3, or as modified by FIG. 6, when the selective calling or first input signal applied to the active filter ceases, it is desirable that the output signal generated in response thereto at output terminal 77 instantaneously terminate. However, the energy in the filter and hence, the amplitude of the output voltage at output terminal 77 tend to decay exponentially in a predictable manner from an initail value which depends on the amount of energy stored in the filter circuit at the time the first input signal terminates. To facilitate a rapid and controlled decrease in the energy decay time, it is desirable to apply a second input or turn-off signal to input terminal 72 of the active filter which is 180 degrees out-of-phase with the output signal and stored energy. In order to generate and send this second input signal from a transmitter, e.g. transmitter 10, the phase of the output signal must be controlled so that it is a known value.

The selective switching between the resonant frequencies is utilized to control the phase of the output signal with respect to the input signal in addition to controlling its amplitude. Referring to curve 113 of FIG. 4, it can be seen that if the amplitude of the input signal is not great enough to cause limiting, i.e. switching of the filter to the second resonant frequency, and if the frequency of the first input signal, which is subject to variation, is just slightly different from the resonant frequency of the active filter, e.g., at corresponding points 140 and 141, it is difficult to accurately determine the phase relationship of the output signal with respect to the input signal because of the steepness of the slope of phase characteristic curve 113 about the resonant frequency. However, if the relation between the amplitude of the input signal and the threshold level is selected so that the filter is operated at its second resonant frequency and limiting is caused for a predetermined portion on the order of 25 percent of a cycle, the phase relationship between the input and output signal will increase to point 142 on curve 113, for instance. Since the slope of curve 113 is less at point 142, the approximate phase of the output signal is determined with greater certainty even though the frequency of the first input signal varies. Thus, deep limiting action can be employed to stabilize the phase of the output signal with respect to the first input signal even though the frequency of the first input signal varies.

Moreover, deep limiting maintains the phase of the output signal at a constant value even though the amplitude of the input signal shifts. Curve 150 of FIG. 7, illustrates the phase difference characteristic between the first input signal and the output signal versus the amount of limiting employed in active filter 63 of FIG. 3. The abscissa of the graph of FIG. 7 is marked off in "decibles into limiting" which is a measure of the amount the amplitude of the input signal increases above the threshold level. The ordinate axis is marked off in degrees of phase shift corresponding to a particular amount of limiting. Referring to curve 150, if the amplitude of the first input signal, having a resonant frequency equal to that of the active filter, is about equal to the amplitude necessary to cause transistor 108 to conduct to cause limiting, the phase shift between the input signal to the active filter and the output signal of the active filter will be zero. If the amplitude of this input signal increases 2 db or about 1.26 greater than the amplitude necessary to cause limiting, the phase difference between the input signal and the output signal will change about 33° Hence, for a 2db increase in amplitude of an input signal having an initial amplitude about equal to the limiting threshold, phase shift of about 33° occurs.

On the other hand, if the initial signal amplitude drives the filter into deep limiting, e.g. 12 db, the phase angle between the input voltage and the output voltage is about 80° (see FIG. 7). However, if the amplitude of the input voltage is now increased by 2 db to where 14 db of limiting occurs the phase difference changes less than 5° . Thus, by designing driver stage 34 of FIG. 1 such that the input signal operates the active filter consistently into deep limiting, the phase of the output signal will remain constant even though there are variations in the frequency of amplitude of the input signal, or in the resonant frequency of the filter. Hence, the phase and amplitude of the second input or reverse burst signal is known to a greater degree of certainty than if deep limiting was not provided. Moreover, the relatively large input signal amplitude necessary for deep limiting provides a reserve which keeps the amplitude of the output signal substantially constant even though the first input signal applied to the receiver is subject to the amplitude variations because of fading and other causes.

What has been described, therefore is an active filter whose resonant frequency is alternately changed from a first predetermined value to a second predetermined value as the amplitude of the input signal applied thereto rises above and falls below a selected threshold value. The change in frequency of the filter maintains the amplitude of the output signal, the quantity of stored energy and the phase between the input and output signal at substantially constant levels even though the amplitude and frequency of the input signal are varying. The active filter is suitable for replacing electromechanical frequency devices previously employed for such functions and it is suitable for manufacture in integrated circuit form thereby reducing the cost and space requirements with respect to prior art electromechanical devices.

I claim:

1. A signal control circuit which derives a sinusoidal output signal having a substantially constant amplitude from a particular sinusoidal input signal which has a predetermined normal frequency and an amplitude that is subject to variation, such signal control circuit including in combination:

resonant circuit means having input, control and output terminals, said resonant circuit means normally having a first resonant frequency which is substantially equal to the normal frequency of the particular input signal, said input terminal of said resonant circuit means being connected to receive the particular input signal, said resonant circuit means developing the output signal at said output terminal thereof in response to the particular input signal, said output signal having an amplitude that tends to vary in response to the amplitude variations of the particular input signal;

amplitude responsive means having input and output terminals, first circuit means connecting said input terminal of said amplitude responsive means to said output terminal of said resonant circuit means so that said amplitude responsive means receives the output signal, said output terminal of said amplitude responsive means being connected to said control terminal of said resonant circuit means, said amplitude responsive means providing control signals to said control terminal in response to and having durations proportional to portions of the output signal that have instantaneous values exceeding a threshold value, said durations of said control signals thereby varying with the amplitude of the particular input signal; and said resonant circuit means being responsive to the existence of each of said control signals to operate at a second resonant frequency during said portions, said resonant circuit means decreasing the amplitude of the output signal derived from the particular input signal in response to being operated at said second resonant frequency, said second resonant frequency being chosen with respect to the predetermined normal frequency of the particular input signal to cause the amplitude of the output signal to remain substantially constant in the presence of the variations in the amplitude of the particular input signal.

2. The signal control circuit of claim 1 wherein said amplitude responsive means includes:

first electron control means having first, second and third electrodes, said first electrode being connected to receive the output signal, second circuit means being adapted to connect said second electrode to reference potential supply means;

load resistor means having first and second ends, said first end of said load resistor means being connected to said third electrode, third circuit means being adapted to connect said second end of said load resistor means to a bias supply means;

said first electron control means being normally nonconductive and having a turn on characteristic which establishes said threshold value whereby said control signals are developed at said first end of said load resistor means; and normally conductive means being coupled between said first end of said load resistor means and said control terminal of said resonant circuit means.

3. The signal control circuit of claim 2 wherein:

said normally conductive means includes second electron control means having first, second and third electrodes, fourth circuit means being adapted to connect said first electrode of said second electron control means to reference potential supply means, said second electrode of said second electron control means being connected to said first end of said load resistor means, said third electrode of said second electron control means being coupled to said control terminal of resonant circuit means;

said second electron control means being rendered normally conductive by voltage and current supplied through said load resistor means so that a first control signal is coupled to said control terminal of said resonant circuit means, said first control signal operating said resonant circuit means to said first resonant frequency;

said first electron control means being rendered conductive by said portions of the output signal which exceed said threshold value; and said second electron control means being rendered nonconductive by said first electron control means being rendered conductive so that a second control signal is coupled to said control terminal of said resonant circuit means, said second control signal operating said resonant circuit means to said second resonant frequency during said portions.

4. The signal control circuit of claim 1 wherein said resonant circuit means has frequency response characteristics similar to those of a parallel tuned circuit.

5. The signal control circuit of claim 4 wherein said amplitude responsive means includes:

amplifying means having an input terminal connected to receive the output signal and an output terminal, said amplifying means having said threshold value and increasing the amplitude of said portions of the output signal which exceed said threshold value to cause said portions to be a predetermined amount greater than said threshold value so that said control signals have durations which approach one-fourth of the period of the output signal, said control signals operating said resonant circuit means to said second resonant frequency during said durations so that the phase difference between the particular input signal and the output signal of said resonant circuit means is virtually constant even though the frequency of the particular input signal varies.

6. The signal control circuit of claim 5 wherein said phase difference between the particular input signal and the output signal is maintained at substantially 70° to facilitate damping of the output signal within a predetermined time in response to a damping input signal having a selected phase difference with respect to the phase of the particular input signal.

7. The signal control circuit of claim 1 wherein said resonant circuit means includes:

active filter means;

component means for determining the resonant frequency of said filter means, said filter means operating at said first resonant frequency in response to said component means being connected thereto and at said second resonant frequency in response to said component means being disconnected therefrom; and normally conductive means having first and second terminals connected in series with said component means and said filter means, said normally conductive means also having a control terminal connected to said amplitude responsive means so that said normally conductive means receives said control signals, and said normally conductive means being rendered nonconductive between said first and second terminals thereof only during and in response to said control signals, said normally conductive means acting to thereby disconnect said component means from said filter means and operate said filter means at said second resonant frequency during the existence of said control signals and at said first resonant frequency during the nonexistence of said control signals.

8. The signal control circuit of claim 1 wherein said resonant circuit means includes:

active filter means;

component means for determining the resonant frequency of said filter means, said filter means operating at said second resonant frequency in response to said component means being connected thereto and at said first resonant frequency in response to said component means being disconnected therefrom; and normally nonconductive means having first and second terminals connected in series with said component means and said filter means, said normally nonconductive means also having a control terminal connected to said amplitude responsive means so that said normally nonconductive means receives said control signals, said normally nonconductive means being rendered conductive between said first and second terminals thereof only during and in response to said control signals, said normally nonconductive means acting to thereby connect said component means to said filter means and operate said filter means to said second resonant frequency during the existence of said control signals and at said first resonant frequency during the nonexistence of said control signals.

9. The signal control circuit of claim 7 wherein said active filter means includes:

first operational amplifier means arranged to operate as a phase inverter and having first and second inputs and an output, said first input of said first operational amplifier means being connected to receive the particular input signal;

second operational amplifier means arranged to operate as a first integrator and having an output and an input, said input of said second operational amplifier means being coupled to said output of first operational amplifier means;

third operational amplifier means arranged to operate as a second integrator and having an input coupled to said output of said second operational amplifier means and an output coupled to said second input of said first operational amplifier means; and the sinusoidal output signal occurring at said output of said second operational amplifier means in response to the particular input signal being applied to said first input of said first operational amplifier means.

10. The signal control circuit of claim 7 wherein said amplitude responsive means and said normally conductive means are comprised of:

bias supply means providing first and second bias potentials at first and second output terminals thereof and a reference potential at a third output terminal thereof, said reference potential having a value between the values of said first and second bias potentials;

differential amplifier means having first and second differential inputs and a differential output, said first differential input being connected to receive the output signal;

potentiometer means having a first terminal connected to said first output terminal of said bias supply means, a second terminal connected to said second output terminal of said bias supply means and an adjustable terminal connected to said second differential input, said adjustable terminal providing a selected portion of the potential difference between said first and second bias potentials to establish said threshold value at said second differential input;

switchable means having first, second and third terminals, said first terminal being connected to said differential output, said second terminal being connected to said third output terminal of said bias supply means, said third terminal of said switchable means being connected to said component means; and said differential amplifier means normally providing a first output signal state at said differential output which renders said switchable means normally conductive so that said component means is normally connected to said active filter means to operate said filter means at said first resonant frequency, said differential amplifier means responding to said portions of the output signal of said active filter means during which the instantaneous magnitudes thereof exceed said threshold value to provide a second output signal state at said differential output, said switchable means being rendered nonconductive by said second output signal state and thereby disconnecting said component means from said filter means to operate said filter means to said second resonant frequency during said portions.

11. The signal control means of claim 7 wherein said component means is a resistor means.

12. In a selective calling system providing a first selected audio frequency input signal having varying frequency and amplitude, and a second selected audio frequency input signal which has the same frequency as the nominal frequency of the first selected input signal and which is out-of-phase with respect to the first selected input signal, with the second selected input signal being developed by the system immediately upon the termination of the first selected input signal, a signal control means for providing a sinusoidal output signal which has a predetermined substantially constant amplitude and phase shift with respect to the first selected input signal thereby enabling the output signal to be damped out within a predetermined time by the second selected input signal, such signal control means including in combination:

active filter means having a frequency response characteristic similar to the frequency response characteristic of a tuned circuit and input, control and output terminals, said active filter means normally having a first resonant frequency which is substantially equal to the frequency of the first selected input signal;

means for applying the first and second selected input signals to said input terminal of said active filter means, said active filter means developing the output signal at said output terminal thereof which has an amplitude that tends to vary slightly with the amplitude variations of the first selected input signal;

amplitude sensing means having input and output terminals;

means for applying the output signal to said input terminal of said amplitude sensing means;

means connecting said output terminal of amplitude sensing means to said control terminal of said active filter means;

said amplitude sensing means providing control signals to said control terminal in response to and during the portions of alternate half cycles of the output signal that have instantaneous magnitudes greater than a threshold level;

said active filter means changing its resonant frequency from said first resonant frequency to a second resonant frequency in response to said control signals so that the selected input signal is attenuated in proportion to its amplitude to develop the output signal having an amplitude maintained at the predetermined substantially constant value; and said threshold level being selected to be less than the usual amplitude of the output signal so that the phase difference between the first selected input signal and the output signal is substantially constant, said predetermined substantially constant amplitude and phase of the output signal enabling the second selected input signal to damp out the output signal within the predetermined time after the first selected input signal ceases.

13. The signal control means of claim 12 wherein said phase difference between the first selected input signal and the output signal is on the order of 70° and said threshold level is on the order of one-fourth the amplitude that the output signal otherwise would have if the signal control means was not developing said control signals.

14. The combination of claim 12 wherein said active filter means further includes:

first operational amplifier means arranged to operate as a phase inverter and having first and second inputs and an output, said first input of said first operational amplifier means being connected to receive the first and second selected input signals;

second operational amplifier means arranged to operate as a first integrator and having an output and an input, said input of said second operational amplifier means being coupled to said output of said first operational amplifier;

equivalent resistance means including a first resistor having first and second ends, a second resistor, and a third resistor, said second resistor being connected to said output of said second operational amplifier, said third resistor being connected in series with said second resistor forming a junction therebetween, said first end of said first resistor being connected to said junction between said second and third resistors, said second end of said first resistor forming said control terminal of said active filter means;

third operational amplifier means arranged to operate as a second integrator and having an input coupled to said third resistor means, and an output coupled to said second input of said first operational amplifier means; and the sinusoidal output signal occurring at said output of said second operational amplifier means in response to the first selected input signal.

* * * * *